(12) United States Patent  
Rusconi Clerici Beltrami et al.

(10) Patent No.: US 11,924,610 B2  
(45) Date of Patent: Mar. 5, 2024

(54) MEMS TRANSDUCER HAVING A DIAPHRAGM MADE OF POLYMER AND METHOD OF PRODUCING SAME

(71) Applicant: USound GmbH, Graz (AT)

(72) Inventors: Andrea Rusconi Clerici Beltrami, Vienna (AT); Ferruccio Bottoni, Graz (AT); Nick Renaud-Bezot, Vienna (AT)

(73) Assignee: USound GmbH, Graz (AT)

( * ) Notice: Subject to any disclaimer, the term of this patent is extended or adjusted under 35 U.S.C. 154(b) by 0 days.

(21) Appl. No.: 17/618,655

(22) PCT Filed: Jun. 4, 2020

(86) PCT No.: PCT/EP2020/065468  
§ 371 (c)(1),  
(2) Date: Dec. 13, 2021

(87) PCT Pub. No.: WO2020/249457  
PCT Pub. Date: Dec. 17, 2020

(65) Prior Publication Data  
US 2022/0360908 A1 Nov. 10, 2022

(30) Foreign Application Priority Data  
Jun. 13, 2019 (DE) .................... 10 2019 116 080.4

(51) Int. Cl.  
*H04R 17/00* (2006.01)  
*B81B 3/00* (2006.01)  
(Continued)

(52) U.S. Cl.  
CPC ........... *H04R 17/005* (2013.01); *B81B 3/007* (2013.01); *B81C 1/00658* (2013.01); *H04R 7/04* (2013.01);  
(Continued)

(58) Field of Classification Search  
CPC ........ H04R 17/005; H04R 7/04; H04R 17/02; H04R 31/003; H04R 2201/003;  
(Continued)

(56) References Cited

U.S. PATENT DOCUMENTS

2004/0113523 A1* 6/2004 Hashimoto ............ G10K 11/02  
310/326  
2005/0134142 A1* 6/2005 Yetter .................... H10N 30/06  
216/53  
(Continued)

FOREIGN PATENT DOCUMENTS

DE 603 13 715 T2 1/2008  
DE 10 2017 200111 B3 3/2018  
(Continued)

OTHER PUBLICATIONS

German Patent Office Search Report, dated Feb. 19, 2020, 9 pages.  
(Continued)

*Primary Examiner* — Norman Yu  
(74) *Attorney, Agent, or Firm* — Dority & Manning, P.A.

(57) ABSTRACT

A method for manufacturing a MEMS sound transducer for generating and/or detecting sound waves in the audible wavelength range and/or in the ultrasonic range, includes arranging at least one piezoelectric element on a support substrate. A diaphragm is formed on the at least one piezoelectric element. In forming the diaphragm, a flowable and curable polymer, which forms the diaphragm after curing, is (Continued)

at least partially cast around the at least one piezoelectric element. The invention further relates to the MEMS sound transducer formed by the method.

15 Claims, 4 Drawing Sheets

(51) Int. Cl.
    *B81C 1/00*     (2006.01)
    *H04R 7/04*     (2006.01)
    *H04R 17/02*     (2006.01)
    *H04R 31/00*     (2006.01)

(52) U.S. Cl.
    CPC ........... *H04R 17/02* (2013.01); *H04R 31/003* (2013.01); *B81B 2201/0257* (2013.01); *B81B 2203/0127* (2013.01); *H04R 2201/003* (2013.01); *H04R 2307/025* (2013.01); *H04R 2400/01* (2013.01)

(58) Field of Classification Search
    CPC .......... H04R 2307/025; H04R 2400/01; B81B 3/007; B81B 2201/0257; B81B 2203/0127; B81C 1/00658
    USPC ........................................ 381/190, 173, 191
    See application file for complete search history.

(56) References Cited

U.S. PATENT DOCUMENTS

| | | | |
|---|---|---|---|
| 2013/0044899 A1* | 2/2013 | Barber | H04R 19/016 |
| | | | 381/113 |
| 2015/0003643 A1 | 1/2015 | Terazono et al. | |
| 2016/0264399 A1* | 9/2016 | Cheng | B81B 3/007 |
| 2016/0337759 A1 | 11/2016 | Kushima et al. | |
| 2017/0094417 A1* | 3/2017 | Kaltenbacher | H04R 25/606 |
| 2019/0289405 A1 | 9/2019 | Littrell et al. | |
| 2020/0100033 A1* | 3/2020 | Stoppel | H04R 17/00 |

FOREIGN PATENT DOCUMENTS

| | | |
|---|---|---|
| DE | 10 2017 205 375 A1 | 10/2018 |
| EP | 2 362 686 A2 | 8/2011 |
| JP | 2011 077919 A | 4/2011 |
| JP | JP 2011077919  * | 4/2011 |
| TW | 201836368 A | 10/2018 |

OTHER PUBLICATIONS

PCT Search Report and Written Opinion, dated Aug. 7, 2020, 15 pages.
TW Office Action and Examination Report EN translation, dated Jul. 26, 2023, 14 pages.

* cited by examiner

MEMS TRANSDUCER HAVING A DIAPHRAGM MADE OF POLYMER AND METHOD OF PRODUCING SAME

CROSS REFERENCE TO RELATED APPLICATIONS

The present application claims priority to International Application Serial No. PCT/EP2020/065468, which is hereby incorporated herein in its entirety by this reference for all purposes.

FIELD OF THE INVENTION

The present invention relates to a method for manufacturing a MEMS sound transducer for generating and/or detecting sound waves in the audible wavelength range and/or in the ultrasonic range, in which at least one piezoelectric element is arranged on a support substrate and a diaphragm is formed on the at least one piezoelectric element.

BACKGROUND OF THE INVENTION

DE 603 13 715 T2 describes a process for manufacturing a MEMS transducer and corresponds to US Patent Application Publication No. 2004-0147132, which is hereby incorporated herein in its entirety by this reference for all purposes. This process includes a sacrificial layer that is applied onto a substrate. Thereafter, a diaphragm layer, a lower electrode layer, an active layer, and an upper electrode layer are consecutively applied.

EXEMPLARY OBJECT AND SUMMARY OF THE INVENTION

The object of the present invention is to improve the related art.

The object is achieved by means of a method for manufacturing a MEMS sound transducer and the MEMS sound transducer having the features described more fully below.

The invention relates to a method for manufacturing a MEMS sound transducer for generating and/or detecting sound waves in the audible wavelength range and/or in the ultrasonic range. The MEMS sound transducer can therefore be utilized, for example, as a loudspeaker for generating music, tones, and/or speech, and/or as a microphone for picking up music, tones, and/or speech. When sound waves in the ultrasonic range are generated and/or detected, these can be utilized, for example, for technical test instruments or in ultrasonic devices for sonography.

In the method, at least one piezoelectric element is arranged on a support substrate. The at least one piezoelectric element for generating and/or detecting the sound waves is therefore arranged on the support substrate. The piezoelectric element has piezoelectric properties, and so the piezoelectric element can convert an electrical signal or a voltage into a deformation, so that the sound waves can be generated as a result. The piezoelectric element can also convert deformations into an electrical signal or a voltage, however, so that the sound waves can be detected as a result.

Moreover, a diaphragm is formed on the at least one piezoelectric element. The diaphragm and the at least one piezoelectric element are coupled to each other as a result. By means of the coupling, vibrations can be exchanged between the diaphragm and the at least one piezoelectric element in order to generate and/or detect the sound waves.

The piezoelectric element can deflect the diaphragm according to an electrical signal or act upon the diaphragm with a vibration, for example, in order to generate the sound waves, and so the diaphragm causes the air situated above the diaphragm to vibrate, which are the sound waves. By comparison, the air vibrating due to the sound waves can also cause the diaphragm to vibrate, which, in turn, is transmitted onto the piezoelectric element. The piezoelectric element converts the vibrations into an electrical signal.

According to the invention, in order to form the diaphragm, a flowable and curable polymer, which, once cured, forms the diaphragm, is at least partially cast around the at least one piezoelectric element. The polymer can therefore be poured in by means of a casting process. In particular, the diaphragm is manufactured by means of a casting process. The flowable polymer therefore adapts, in particular on its own, to a contour and/or possible unevenness. The polymer can have, for example, such a viscosity that it automatically flows around the piezoelectric element. The diaphragm is therefore formed from a polymer that has not yet cured, so that the diaphragm can be manufactured in one simple manufacturing step. The polymer, which forms the diaphragm, is therefore still liquid and/or flowable. The liquid and/or flowable polymer can also be cast around the at least one piezoelectric element, which can also be carried out in an easy way. The polymer at least partially surrounds the at least one piezoelectric element. As a result, the diaphragm is coupled to the at least one piezoelectric element, in that the piezoelectric element is covered by the diaphragm. The diaphragm is therefore arranged directly on the piezoelectric element and/or is directly connected to the piezoelectric element. Furthermore, the polymer is poured around the piezoelectric element if the piezoelectric element is already arranged on the support substrate.

It is advantageous when the support substrate is stiff. It has, in particular, a stiffness that is so high that the support substrate does not oscillate or only insubstantially oscillates during the operation of the MEMS sound transducer. Therefore, it is not the support substrate, but rather the diaphragm cast onto the at least one piezoelectric element that is designed for generating sound and/or for detecting sound. In particular, the stiffness of the support substrate is greater than the stiffness of the diaphragm after curing.

In particular, the at least one piezoelectric element and/or the diaphragm oscillate(s) with respect to the support substrate.

Furthermore, it is advantageous when the at least one piezoelectric element is first placed onto the support substrate and, thereafter, the polymer is cast around the at least one piezoelectric element.

Once the polymer has cured, the diaphragm advantageously has a flexibility and/or elasticity.

For the sake of simplicity, mention can also be made merely of the piezoelectric element rather than of the at least one piezoelectric element.

Moreover, the MEMS sound transducer can have at least one feature of the following description. In particular, the MEMS sound transducer can be manufactured in such a way that it has at least one feature of the following description.

Once the polymer has cured, the diaphragm, i.e., the cured polymer, has one further advantage. The diaphragm formed from the cured polymer and the piezoelectric element form a composite. The piezoelectric element can be made, for example, of a ceramic. Furthermore, it is better for the vibration behavior of the piezoelectric element when the piezoelectric element is relatively thin. As a result, however, the risk of the piezoelectric element breaking increases. The piezoelectric element can be stabilized with the aid of the diaphragm formed from the cured polymer, which has also an elasticity and flexibility after curing. The diaphragm formed from the cured polymer and the piezoelectric element form a composite system, in which the diaphragm stabilizes the piezoelectric element.

Due to the fact that the diaphragm is liquid and/or flowable at the beginning of the manufacturing process, the polymer can well surround, enclose, cover, wet, and/or flow around the at least one piezoelectric element.

The polymer can be based, for example, on silicone. The polymer can be an organic or inorganic polymer. The polymer can be a plastic.

It is advantageous when adhesion is formed between the piezoelectric element and the diaphragm. The diaphragm is therefore connected to the piezoelectric element by means of an adhesive bond.

It is advantageous when the at least one piezoelectric element is arranged in a receiving space of a dam arrangement, so that the piezoelectric element is completely bordered by the dam arrangement. The receiving space can have the form of a basin, which is delimited by the support substrate, the at least one piezoelectric element, and the dam arrangement. The polymer, which has not yet cured, i.e., is liquid and/or flowable, can be filled or poured into the receiving space or into the basin during the process of manufacturing the MEMS sound transducer. The polymer in the basin or the receiving space then surrounds at least the at least one piezoelectric element and, once cured, forms the diaphragm. The dam arrangement and the at least one piezoelectric element are arranged on the same side, a top side, of the support substrate. Furthermore, the dam arrangement can be a frame, which is arranged completely around the at least one piezoelectric element.

The dam arrangement can be or will be formed, for example, as one piece with the support substrate. The MEMS sound transducer can be formed, for example, on a wafer. The support substrate can then be an area of the wafer, wherein the dam arrangement is also formed from the wafer.

Additionally or alternatively, the dam arrangement can also be arranged on the support substrate. For example, the dam arrangement can be manufactured in a separate process and then arranged on the support substrate. Moreover, additionally or alternatively, the dam arrangement can also be formed directly on the support substrate. The dam arrangement can be formed on the support substrate, for example, by means of a deposition process.

The support substrate and/or the dam arrangement can be formed, for example, from a silicon wafer.

In addition, the receiving space can be formed first and, thereafter, the piezoelectric element can be arranged in the receiving space. Alternatively, the piezoelectric element can also be arranged on the support substrate first and, thereafter, the receiving space can be formed.

It is advantageous when the polymer is filled into the receiving space. The receiving space therefore forms a container for the polymer. The polymer can be filled into the receiving space until the at least one piezoelectric element is completely covered with the polymer. As a result, the diaphragm is formed completely over the piezoelectric element.

It is advantageous when the dam arrangement is at least partially formed from at least one dam unit. Elements, for example, that are arranged on the support substrate anyway, can act as a dam arrangement. An element of this type can be, for example, an ASIC, which is arranged on the support substrate in order to control the MEMS sound transducer.

The dam arrangement can be formed with the aid of the at least one dam unit, so that the piezoelectric element is completely bordered. The ASIC therefore forms a partial section of the dam arrangement.

It is advantageous when the dam arrangement is formed at least partially as one piece with the support substrate. The support substrate can be, for example, a circuit board. The dam arrangement can therefore also be made of the material, for example, a plastic. The dam arrangement can therefore be formed together with the support substrate. In the process, the dam units can also be formed as one piece with the support substrate.

Additionally or alternatively, the dam arrangement be at least partially connected to the support substrate. As a result, after the piezoelectric element has been arranged on the support substrate, the dam arrangement can be arranged on the support substrate, in order to deal with the precise arrangement of the at least one piezoelectric element. The dam arrangement can be adhered, for example, to the support substrate. Additionally or alternatively, the at least one piezoelectric element can also be adhesively bonded on the support substrate. The adhesive, with which the dam arrangement and/or the piezoelectric element are/is arranged on the support substrate, can be, for example, electrically non-conductive, i.e., insulating. The at least one dam unit can also be connected to the support substrate or adhesively bonded thereto in the aforementioned way.

It is advantageous when the receiving space is completely filled with the polymer. As a result, it can be ensured that all elements in the receiving space are covered and/or enclosed by the polymer. Additionally or alternatively, polymer arranged over the dam arrangement can be stripped off and/or pulled off. It can happen, in particular when the receiving space is completely filled with polymer, that polymer extends above the dam arrangement. The projecting polymer can then be pulled off and/or stripped off, for example, by means of a pull-off edge. As a result, the polymer is pulled off precisely at the level of the dam arrangement. The dam arrangement and the polymer as well as the subsequently formed diaphragm therefore form a flush plane or surface.

It is advantageous when the dam arrangement is formed as one piece together with the support substrate. For example, the support substrate and the dam arrangement can be formed by means of a deposition process and/or an etching process.

Additionally or alternatively, the dam arrangement and/or the at least one piezoelectric element can be arranged on the support substrate. This can take place, for example, by means of adhesive bonding, soldering, and/or eutectic bonding. In the case of adhesive bonding, an electrically insulating, i.e., electrically non-conductive, adhesive can be utilized.

Additionally or alternatively, the dam arrangement can also be cast onto the support substrate.

It is advantageous when multiple piezoelectric elements are arranged on the support substrate.

It is advantageous when the piezoelectric elements each have a base element and a cantilever arm, wherein the cantilever arm is connected at a first end to the base element and a second end of the cantilever arm can oscillate in the direction of a stroke axis, wherein the piezoelectric elements are arranged on the support substrate in such a way that their second ends meet in a center. The piezoelectric elements can therefore be concentrically arranged. The piezoelectric elements can be symmetrically or asymmetrically concentrically arranged.

Furthermore, the base elements can be designed to be straight and/or curved. When the piezoelectric elements are concentrically arranged, the base elements can have such a curvature that all base elements together form a circle. All base elements can also form an ellipse, however, and, therefore, are bent or curved.

It is advantageous when the multiple piezoelectric elements are designed as a piezoelectric unit. The base elements can be integrally formed, so that the multiple piezoelectric elements are contiguous and form the piezoelectric unit. As a result, in the manufacturing process, the multiple piezoelectric elements can be placed, as a piezoelectric unit, upon the support substrate in one step.

Additionally or alternatively, the cantilever arms can be connected to each other in an area at their second ends, in particular in the center. As a result, the cantilever arms can oscillate as one single cantilever arm. As a result, the cantilever arms are coupled. Advantageously, the cantilever arms are designed in such a way that they are already connected at the second ends.

It is advantageous when the multiple piezoelectric elements are arranged as a polygon. The piezoelectric elements can also be designed as a hexagon. Therefore, six piezoelectric elements are located on the support substrate. The MEMS sound transducer therefore includes six piezoelectric elements.

It is advantageous when the at least one piezoelectric element is connected with at least one line to a connection point on the support substrate. If the support substrate is a circuit board, it can include the connection point, via which the electrical signals can be exchanged between the piezoelectric element and a control unit. Each piezoelectric element can be connected with one associated line to one connection point. The polymer can also be cast around the lines, so that the lines are fixed and/or protected.

It is advantageous when acoustic openings and/or a passage opening are/is arranged in the support substrate. Acoustic properties of the MEMS sound transducer can be adjusted with the aid of the acoustic openings or the at least one acoustic opening.

The passage opening can be arranged in an area spaced apart from the center in the direction of the stroke axis. The piezoelectric elements can extend into the passage opening while oscillating. As a result, the piezoelectric elements do not impact the support substrate.

It is advantageous when the at least one piezoelectric element and/or the dam arrangement are/is accommodated and placed upon the support substrate, in particular by way of an assembly unit. As a result, the manufacturing process is simplified. Furthermore, with the aid of the assembly unit, the piezoelectric element and/or the dam arrangement can be placed on the support substrate with high accuracy.

It is advantageous when multiple MEMS sound transducers, which are separated from one another, are arranged on the support substrate. The support substrate can be a wafer, which can have a diameter up to 45 cm. Multiple MEMS sound transducers can be arranged thereon, so that a plurality of MEMS sound transducers is formed in a manufacturing process. A correspondingly large number of dam arrangements and piezoelectric elements is arranged on the support substrate. The dam arrangement can be, for example, a grid, which is placed upon the support substrate, wherein each window of the grid forms a receiving space. The polymer can then be poured onto the support substrate, for example, the wafer, in a planer manner, flows into the plurality of receiving spaces and surrounds the piezoelectric elements arranged therein. At least one piezoelectric element is arranged in each receiving space. The polymer can still be spread or distributed and/or pulled off or stripped off.

The support substrate, the at least one piezoelectric element, and the dam arrangement can be formed layer by layer.

Multiple MEMS sound transducers can also be arranged on the support substrate. The MEMS sound transducers can then be separated from one another. For this purpose, the support substrate can be separated. As a result, multiple MEMS sound transducers can be manufactured in one manufacturing process.

Moreover, the invention relates to a MEMS sound transducer for generating and/or detecting sound waves in the audible wavelength range and/or in the ultrasonic range.

The MEMS sound transducer includes a support substrate.

Furthermore, the MEMS sound transducer includes at least one piezoelectric element arranged on the support substrate for generating and/or detecting sound waves.

In addition, the MEMS sound transducer includes a diaphragm, which is coupled to the at least one piezoelectric element, so that vibrations can be exchanged between the diaphragm and the at least one piezoelectric element in order to generate and/or detect sound waves.

According to the invention, the sound transducer is designed by means of at least one method feature according to the preceding description and/or the following description.

It is advantageous when the at least one piezoelectric element is arranged in a receiving space of a dam arrangement, which completely borders the at least one piezoelectric element.

Additionally or alternatively, the dam arrangement can be at least partially formed from at least one dam unit. With the aid of the dam unit, the dam arrangement can be formed as necessary.

Additionally or alternatively, the dam arrangement, in particular the at least one dam unit, can be formed as one piece with the support substrate and/or arranged on the support substrate.

It is advantageous when the at least one piezoelectric element and the dam arrangement are spaced apart from one another in a transverse direction. The transverse direction is oriented transversely to a stroke axis of the cantilever arms. Furthermore, the transverse direction is oriented in parallel to the support substrate. Due to the distance between the dam arrangement and the piezoelectric element, the polymer can flow between these two. As a result, the dam arrangement and the piezoelectric element can be fixed against each other.

It is advantageous when the dam arrangement has a dam height over the support substrate, which is higher or greater than a piezoelectric element height of the at least one piezoelectric element over the support substrate. As a result, the polymer, which has not yet cured, can be filled into the basin formed by the dam arrangement. The basin can accommodate the polymer at least to the extent that the at least one piezoelectric element is completely covered. The dam height can have a value, for example, that corresponds to the piezoelectric element height plus a thickness of the diaphragm. As a result, the polymer, which has not yet cured, can be filled into the basin and, thereafter, stripped off, so that the dam arrangement forms a plane with the polymer. As a result, exactly the diaphragm is formed having the desired thickness. The diaphragm is then flush with the dam arrangement.

It is advantageous when the at least one piezoelectric element has at least one base element and a cantilever arm, wherein the cantilever arm is connected at a first end to the base element and a second end of the cantilever arm spaced apart from the base element can oscillate in the direction of a stroke axis. Upon application of the voltage or of the electrical signal, the cantilever arm can oscillate along the stroke axis, so that sound waves can be generated with the piezoelectric element and the diaphragm. The cantilever arm itself can also be caused to vibrate by the diaphragm, so that the sound waves can be detected as a result. Furthermore, the piezoelectric element is arranged on the support substrate by means of the at least one base element. The cantilever arm can be completely covered by the diaphragm.

It is advantageous when a hollow space is arranged between the at least one piezoelectric element and the support substrate, which is delimited by the support substrate and the piezoelectric element, in particular the base element and/or the cantilever arm. The hollow space forms a resonant cavity, with which the acoustic properties of the MEMS sound transducer can be improved. The hollow space is arranged on the side of the piezoelectric element opposite the diaphragm. Furthermore, the at least one piezoelectric element can swing into the hollow space. The hollow space is therefore arranged under the piezoelectric element in the direction of the stroke axis.

It is advantageous when the MEMS sound transducer has multiple piezoelectric elements. As a result, the acoustic performance can be enhanced. For example, as a result, music can be generated with a greater performance. If the MEMS sound transducer is operated as a microphone, however, quieter tones can be detected. When multiple piezoelectric elements are present, a portion can also be operated as a loudspeaker and another portion can be operated as a microphone.

Furthermore, it is advantageous when the multiple piezoelectric elements are arranged on the support substrate in such a way that they meet in a center with their particular second ends. As a result, the multiple piezoelectric elements can act as a single, correspondingly larger, piezoelectric element. It can be simpler to form one large piezoelectric element out of multiple smaller piezoelectric elements than to manufacture one single large piezoelectric element. In addition, the multiple piezoelectric elements can be combined into various shapes.

It is advantageous when the second ends of the piezoelectric elements are connected to each other in the center. As a result, the multiple piezoelectric elements can be operated better than a single large piezoelectric element.

It is advantageous when the multiple piezoelectric elements are arranged around the center in the shape of a polygon, in particular in a hexagonal manner. Additionally or alternatively, the cantilever arm of the at least one piezoelectric element can be designed in a triangular shape. The first end of the cantilever arm can have or form the base side of the triangle. Advantageously, a base side of the polygon is always arranged at the first end, so that the first end is connected to the base element and, as a result, a planar connection can be formed between the cantilever arm and the base element. The tip of the triangle can then be arranged at the second end of the cantilever arm. The tips of multiple cantilever arms or triangles can therefore meet in the center.

It is advantageous when the cantilever arm of the at least one piezoelectric element has a spring section in the area of the second end. Additionally or alternatively, the cantilever arm can also have a spring element at the second end.

Moreover, it is advantageous, additionally or alternatively, when the cantilever arms are connected to each other by means of the spring sections and/or the spring elements. In addition, only a portion of the piezoelectric elements can have a spring section and/or a spring element. For example, when two piezoelectric elements are diametrically opposed, only one piezoelectric element can have a spring section and/or a spring element. With the aid of the spring section and/or of the spring element, the piezoelectric elements can be moved, even though they are connected to each other in the center. The spring sections and/or the spring elements extend when the piezoelectric elements are deflected or oscillate.

It is advantageous when the multiple piezoelectric elements are arranged concentrically to one another.

Furthermore, it is advantageous when the particular base elements of the multiple piezoelectric elements are integrally formed. Consequently, the piezoelectric elements are connected to each other and, thereby, form a piezoelectric unit made of multiple piezoelectric units. The piezoelectric unit can then be placed, as a component, onto the support substrate.

It is advantageous when the support substrate has a passage opening, which is arranged under the center and/or the spring sections and/or the spring elements in the direction of the stroke axis. As a result, the swingable second end of the cantilever arm of the at least one piezoelectric element can move into the passage opening while oscillating. As a result, the cantilever arm can be prevented from impacting the support substrate while oscillating.

Additionally or alternatively, it is advantageous when the support substrate has at least one acoustic opening, which is arranged in the area of the hollow space. As a result, the acoustic properties of the MEMS sound transducer can be adjusted. For example, as a result, resonance properties of the hollow space can be adjusted.

It is advantageous when the spring section and/or an area between two adjacent piezoelectric elements are/is designed in such a way that they are tight with respect to the polymer. The multiple piezoelectric elements and/or the at least one spring section therefore have/has a seal tightness with respect to the polymer. As a result, the polymer, which has not yet cured, can be prevented from flowing into the hollow space. For example, the two adjacent piezoelectric elements can be spaced apart from one another to such an extent that the liquid polymer is retained. The spacing depends on the viscosity of the polymer.

It is advantageous when the support substrate is designed as a circuit board. The support substrate can also have connection points. As a result, with the aid of the support substrate, the electrical signal or the voltage can be routed to the at least one piezoelectric element and/or routed away therefrom.

Additionally or alternatively, the at least one piezoelectric element can be electrically connected with a line to a connection point. The line can be cast into the polymer. In the manufacturing process, the liquid polymer therefore also flows around the line. As a result, the line can be protected against damage.

BRIEF DESCRIPTION OF THE DRAWINGS

Further advantages of the invention are described in the following exemplary embodiments, wherein.

DETAILED DESCRIPTION OF EXEMPLARY EMBODIMENTS OF THE INVENTION

Figure 1:
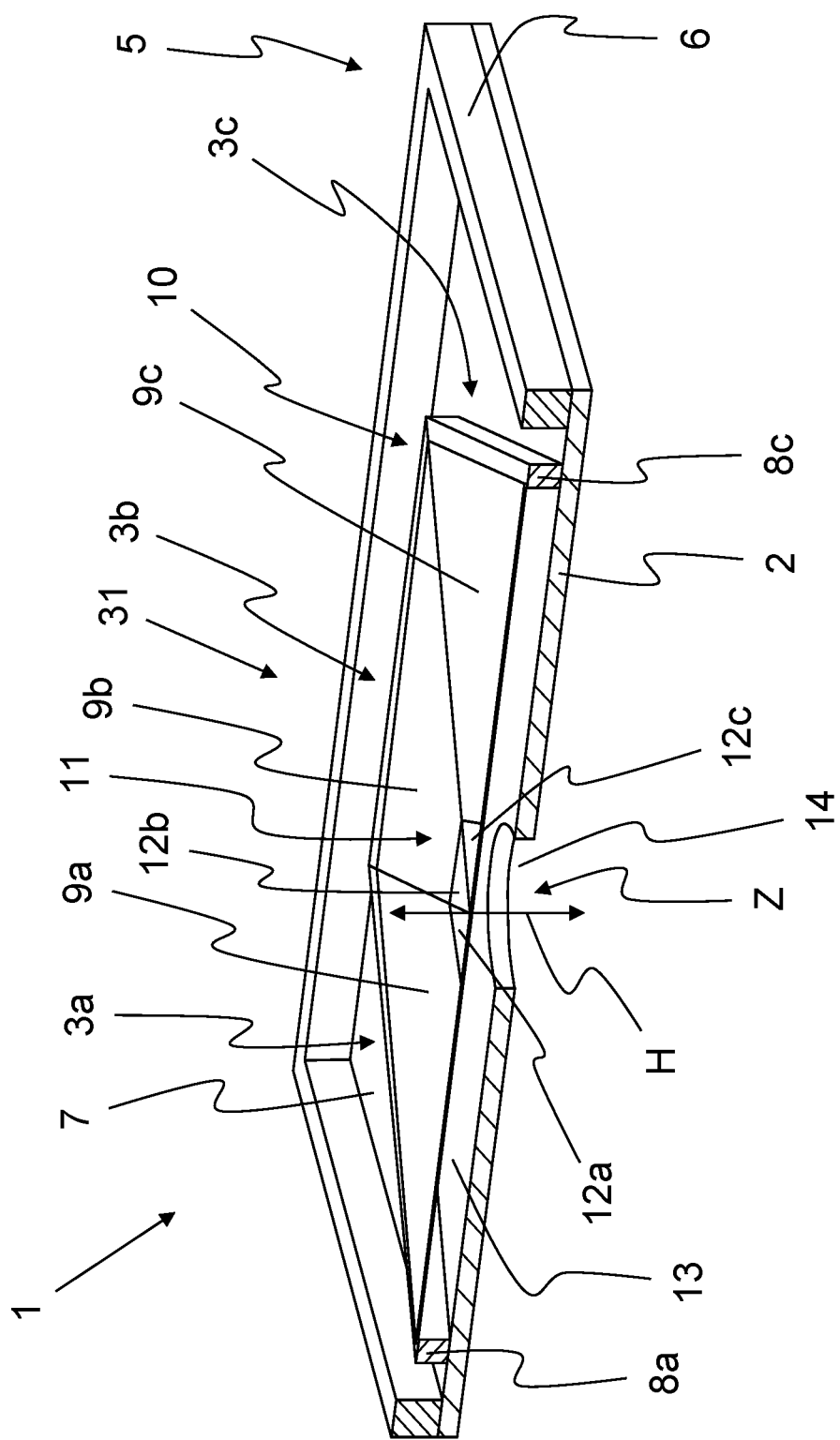
FIG. 1 shows a perspective sectional view taken in the direction of arrows A-A in FIG. 2 of a schematic MEMS sound transducer having a piezoelectric element arranged on a support substrate.

FIG. 1 shows a perspective side view of a schematic MEMS sound transducer 1 having at least one piezoelectric element 3a-3c arranged on a support substrate 2. The MEMS sound transducer 1 shown here is shown merely as one half. For the sake of simplicity, mention can be made in the following description of merely one piezoelectric element 3. Mention can be made of multiple piezoelectric elements 3a-3c when this is advantageous for the description. For the sake of clarity, features can also be first described and provided with a reference character in a following figure.

Sound waves can be detected and/or generated with the aid of the at least one piezoelectric element 3. The MEMS sound transducer 1 can therefore be operated as a loudspeaker and/or as a microphone with the aid of the at least one piezoelectric element 3.

The piezoelectric element 3 is coupled to a diaphragm 4 (FIG. 3), which is not shown here in FIG. 1, as the diaphragm 4 is first shown in one of the following figures. With the aid of the diaphragm 4, air situated above the diaphragm 4 can be caused to vibrate, so that the sound waves are generated. The diaphragm 4 is caused to vibrate, in that an electrical signal is applied to the piezoelectric element 3, so that the piezoelectric element 3 deflects according to the signal. By this same configuration, the vibrating air can cause the diaphragm 4 itself to vibrate, wherein the piezoelectric element 3 vibrates along therewith. The piezoelectric element 3 converts its own vibrations into an electrical signal, and so the sound transducer can function as a microphone wherein the sound waves are detected.

Figure 3:
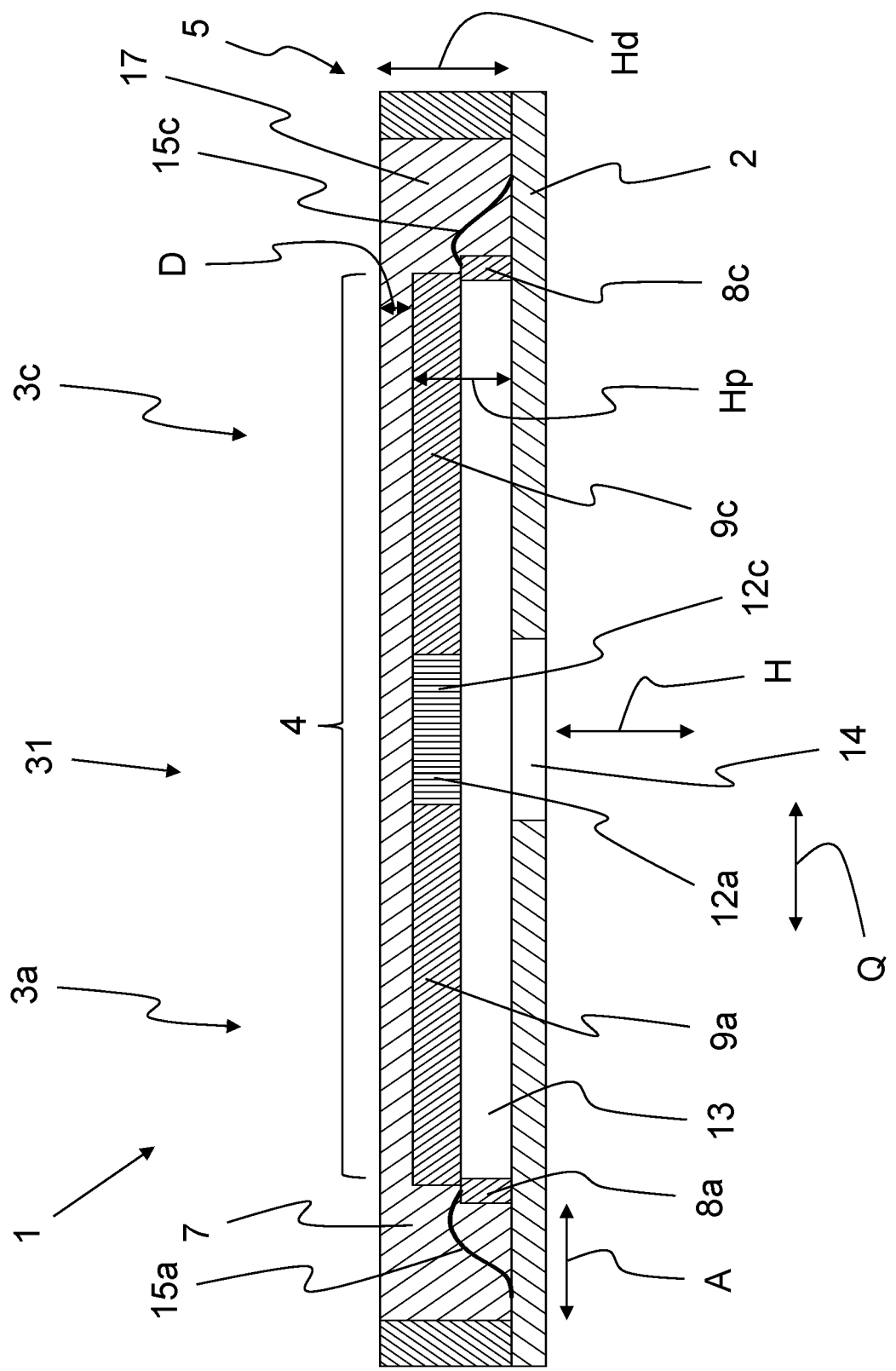
FIG. 3 shows a sectional view of the MEMS sound transducer having a diaphragm.

The diaphragm 4 is formed from a cured polymer 17, which is at least partially cast around the at least one piezoelectric element 3 as schematically shown in FIG. 3. The cured polymer 17 can also be cast around the piezoelectric element 3. The polymer 17 was therefore liquid and/or flowable and curable during the manufacturing process, so that the piezoelectric element 3 can be coated, in particular cast around, in an easy way. Once the polymer 17 has cured, the diaphragm 4 is formed.

The cured polymer 17 also has a flexibility and softness after curing, and so the diaphragm 4 formed thereon has an elasticity. The elasticity of the diaphragm 4 also depends on its thickness D (schematically shown in FIG. 3), in particular over the piezoelectric element 3 shown in FIG. 1.

The thickness D of the diaphragm 4 on the at least one piezoelectric element 3 can be, for example, between 0.05 mm and 0.2 mm. The thickness D of the diaphragm 4 can also be 0.1 mm, however. The thickness of the diaphragm 4 is measured in the direction of the stroke axis H schematically shown in FIG. 1 and FIG. 3. The thickness D of the diaphragm 4 is provided with a reference character in FIG. 3.

The diaphragm 4 on the piezoelectric element 3 form, together, a composite system. The piezoelectric element 3 made of a piezoelectric material has a high stiffness, and so the piezoelectric element 3 can break solely upon deformation. The piezoelectric element 3 is supported by a coating of a cured polymer 17, which also forms the membrane 4 and has elasticity. The diaphragm 4 holds the piezoelectric element 3 together. The breakage of the piezoelectric element 3 can therefore be prevented.

In this exemplary embodiment schematically shown in FIG. 1 for example, a dam arrangement 5 is arranged on the support substrate 2. Additionally or alternatively, the dam arrangement 5 can also be or will be formed as one piece with the support substrate 2. The dam arrangement 5 advantageously completely borders the piezoelectric element 3. A receiving space 7 is formed by the dam arrangement 5 and the support substrate 2. In the manufacturing process, the liquid and/or flowable polymer 17 can be filled into the receiving space 7, so that the polymer 17 is cast around or encloses the piezoelectric element 3. Thereafter, the polymer 17 can cure, wherein the diaphragm 4 forms. The dam arrangement 5, the support substrate 2, and/or the at least one piezoelectric element 3 form(s) the receiving space 7 or a basin, into which the liquid and/or flowable polymer 17 can be filled.

The dam arrangement 5 can be formed from at least one dam unit 6, which is schematically shown in FIG. 6. In this exemplary embodiment, the dam unit 6 and/or the dam arrangement 5 are/is designed as a frame, which borders the at least one piezoelectric element 3. The at least one dam unit 6 can also be formed from multiple individual elements, which are or will be arranged on the support substrate 2 in such a way that the dam arrangement 5 completely borders the at least one piezoelectric element 3. Elements that are already present on the support substrate 2 can also act as the dam arrangement 5. For example, a control unit, for example, in the form of an ASIC, arranged on the support substrate 2 can act as part of the dam arrangement 5. The dam unit 6 can then be designed in such a way that the dam unit 6 and the ASIC form the dam arrangement 5.

The dam arrangement 5, in particular the at least one dam unit 6 shown here, is connected to the support substrate 2 according to the present exemplary embodiment. The dam arrangement 5 can be adhesively bonded, for example, onto the support substrate 2. As the adhesive, for example, an electrically non-conductive, i.e., an electrically insulating, adhesive can be utilized. Alternatively, the dam arrangement 5 can also be formed as one piece with the support substrate 2. As a result of this unitary formation, for example, the manufacturing process of the MEMS sound transducer 1 can be simplified.

Figure 2:
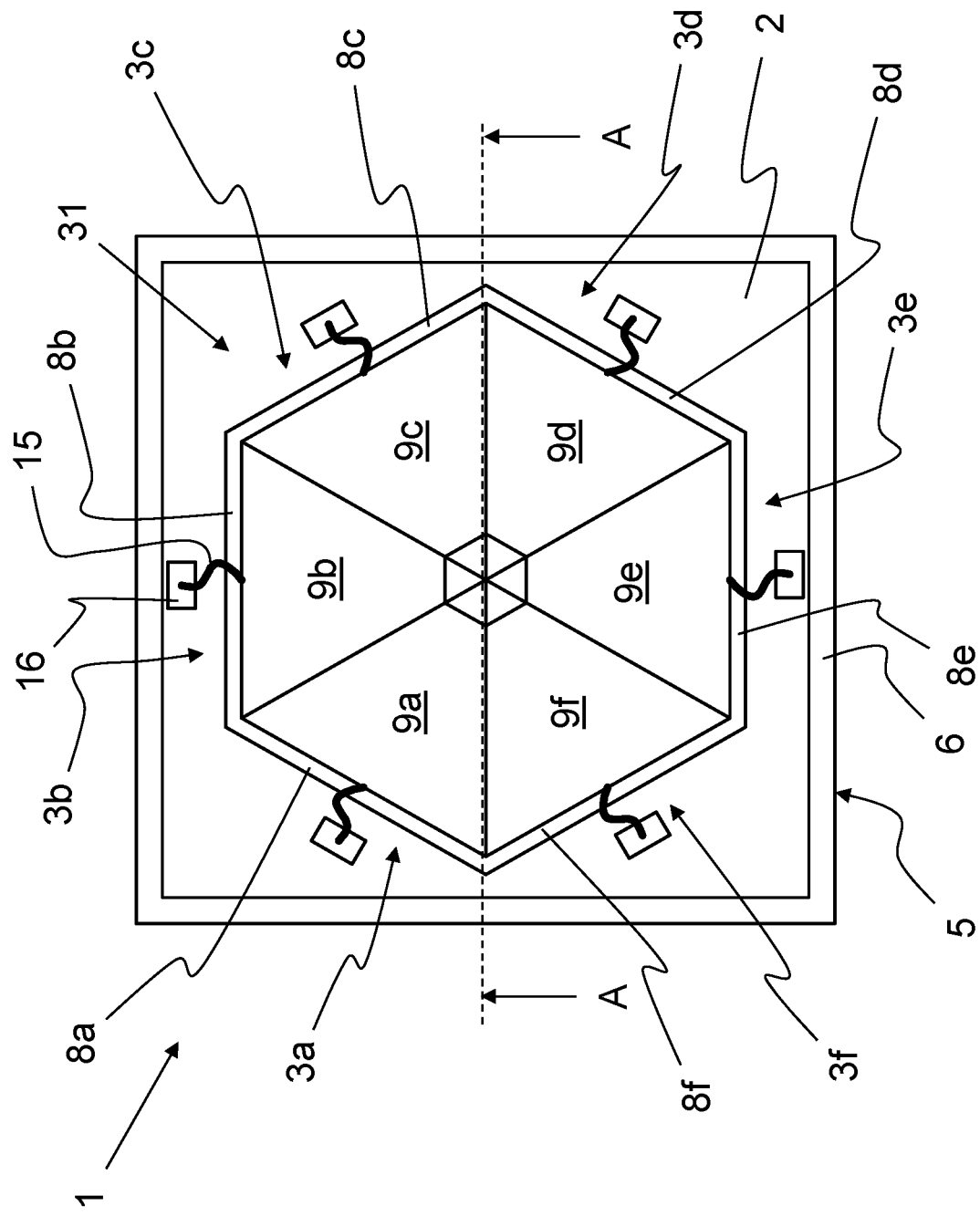
FIG. 2 shows a top view of the MEMS sound transducer having six piezoelectric elements.

The at least one piezoelectric element 3 includes a base element 8 and a cantilever arm 9 in the exemplary embodiment shown here in FIG. 2 and FIG. 3 for example. The three piezoelectric elements 3a-3c shown here in FIG. 1 include a base element 8a-8c, respectively, and a cantilever arm 9a-9c, respectively. The base element 8b is not visible in the view shown here in FIG. 1. It is concealed by the cantilever arm 9b. For the sake of simplicity, mention is made of merely one base element 8 and one cantilever arm 9.

The cantilever arm 9 has a first end 10 and a second end 11 spaced apart therefrom. For the sake of clarity, the first end 10 and the second end 11 are provided with a reference character only at the cantilever arm 9b in FIG. 1. The two ends 10, 11 are identical in all piezoelectric elements 3 and cantilever arms 9.

The cantilever arm 9 is connected at the first end 10 to the base element 8. The second end 11 is spaced apart from the base element 8. The cantilever arm 9 is therefore fixed at the base element 8 with the first end 10. The second end 11 can oscillate freely with respect to the first end 10. The second end 11 can oscillate in the direction of the stroke axis H.

In the present exemplary embodiment, the at least one piezoelectric element 3 is designed in the shape of a triangle. All piezoelectric elements 3 are triangular here. A base side of the triangle is connected to the base element 8. As a result, a connection region between the cantilever arm 9 and the base element 8 is enlarged. A tip of the triangle is arranged at the second end 11. In particular as schematically shown in FIG. 1, all tips of all piezoelectric elements 3 meet in the center Z. Three triangular piezoelectric elements 3 are shown in the half sectional view shown in the present case. The complete MEMS sound transducer 1 therefore has six triangular piezoelectric elements 3, which are arranged in such a way that a hexagon, which desirably is regular, forms.

The second ends 11 of the particular cantilever arms 9 meet in a center Z. According to the present exemplary embodiment, the center Z is arranged in the center between the particular piezoelectric elements 3. The piezoelectric elements 3, in particular the second ends 11 of the particular cantilever arms 9, can be connected to each other in the center Z. Consequently, the multiple piezoelectric elements 3 can oscillate as a single, correspondingly larger, piezoelectric element 3. As a result, a performance, in particular a loudspeaker performance and/or a microphone performance, of the MEMS sound transducer 1 can be enhanced.

The piezoelectric element 3 has a spring section 12 in the area of the second end 11 of the cantilever arm 9. For the sake of simplicity, mention is made merely of one spring section 12. Mention is made of the spring sections 12a-12c when this is necessary for the invention.

The spring sections 12a-12c can extend when the piezoelectric elements 3 oscillate in the direction of the stroke axis H. As a result, the piezoelectric elements 3 can be prevented from tearing or breaking when they oscillate and are connected to each other in the center Z.

Furthermore, the piezoelectric elements 3 can be connected to each other, in particular only, with the spring sections 12.

The MEMS sound transducer 1 also has a hollow space 13 as schematically shown in FIG. 1 and FIG. 3. The hollow space 13 is arranged between the at least one piezoelectric element 3 and the support substrate 2 in the direction of the stroke axis H. The hollow space 13 is arranged on the side of the at least one piezoelectric element 3 facing away from the receiving space 7. The at least one piezoelectric element 3 separates the receiving space 7 from the hollow space 13. The piezoelectric element 3 can swing into the hollow space 13. Furthermore, the hollow space 13 can be a resonant cavity. The hollow space 13 is arranged under the piezoelectric element 3 in the direction of the stroke axis H. The piezoelectric element 3 can therefore swing into the hollow space 13.

Moreover, as schematically shown in FIG. 1, a passage opening 14 is defined in and through the support substrate 2 of the present exemplary embodiment. Here, the passage opening 14 is arranged under the center Z in the direction of the stroke axis H. The passage opening 14 can function as a sound outlet opening and/or a sound inlet opening. Additionally or alternatively, the second ends 11 can swing into the passage opening 14.

FIG. 2 shows the MEMS sound transducer 1 with six piezoelectric elements 3a-3f. For the sake of simplicity, features that have already been described in the preceding figure and that essentially have the same effect are not described once again here. In addition, features that are identical in comparison to the preceding figure are provided with identical reference characters. For the sake of clarity, features can also be first described in a following FIG. 3 for example.

According to the exemplary embodiment shown here in FIG. 2, the six piezoelectric elements 3a-3f are arranged in a hexagon, which desirably is a regular hexagon. The piezoelectric elements 3 can be regularly arranged, also when fewer or more than six piezoelectric elements 3 are arranged on the support substrate 2. For example, four piezoelectric elements 3 can also be arranged in a quadrangle or eight piezoelectric elements 3 can be arranged in an octagon.

In the present exemplary embodiment, the piezoelectric elements 3 can be designed as equilateral triangles. This means, each angle in the triangle is 60°.

According to the present exemplary embodiment, each piezoelectric element 3 is electrically connected by means of a line 15 to a connection point 16 on the support substrate 2. When the support substrate 2 is designed as a circuit board, the connection points 16 are electrically connected to the circuit board and/or are part of the circuit board. For the sake of simplicity and clarity, only one line 15 and one connection point 16 are provided with a respective reference character.

Moreover, according to the present exemplary embodiment, the base elements 8a-8f are integrally formed as a unitary structure during a casting or molding operation. Alternatively, at least a portion of the base elements 8a-8f can also be separately formed and thereafter joined together. The base elements 8a-8f are advantageously adjacent to one another or abut one another, however, so that the liquid and/or flowable polymer 17 cannot flow between the base elements 8a-8f.

FIG. 3 shows a section of the MEMS sound transducer 1 having a diaphragm 4 made of cured polymer 17. For the sake of simplicity, features that have already been described in the preceding figure and that essentially have the same effect are not described once again here. In addition, features that are identical in comparison to the preceding figures are provided with identical reference characters. For the sake of clarity, features can also be first described in a following figure. For the sake of clarity, the MEMS sound transducer 1 is depicted in FIG. 3 to be thicker than its actual dimensions. The proportions, in particular in the direction of the stroke axis H, are enlarged for better visibility.

According to the present exemplary embodiment, the receiving space 7 is filled with the polymer 17. The polymer 17 can also surround the lines 15a, 15b, so that damage can be prevented.

The polymer 17 is also arranged on the at least one piezoelectric element 3, so that it forms the diaphragm 4. The sound waves can be detected and/or generated with the aid of the diaphragm 4. The diaphragm 4 still has an elasticity, however, and forms a composite system with the piezoelectric element 3, wherein the diaphragm 4 prevents the piezoelectric element 3 from breaking. The diaphragm 4 is arranged directly on the piezoelectric element 3, in particular the cantilever arm 9. For example, adhesion can be formed between the diaphragm 4 and the piezoelectric element 3, in particular the cantilever arm 9. The adhesion arises when the liquid and/or flowable polymer 17 cures. The polymer 17 and/or the diaphragm 4 can be adhered to the piezoelectric element 3, in particular the cantilever arm 9.

Moreover, the at least one piezoelectric element 3 is tight with respect to the liquid and/or flowable polymer 17. As a result, polymer 17 is prevented from flowing into the hollow space 13. When multiple piezoelectric elements 3 are arranged on the support substrate 2, the points at which the piezoelectric elements 3 are adjacent to one another have a seal tightness, so that the polymer 17 also cannot flow into the hollow space 13 there.

In addition, the spring section 12 has a seal tightness, so that the liquid and/or flowable polymer cannot flow through the spring section 12.

The tightness of the aforementioned seal depends, of course, on a viscosity of the liquid and/or flowable polymer 17. The viscosity of the polymer 17 is such that it automatically spreads in the receiving space 7 and, for example, also flows around the lines 15.

Furthermore, the dam arrangement 5, in particular the at least one dam unit 6, has a dam height Hd schematically shown in FIG. 3. The at least one piezoelectric element 3 has a piezoelectric element height Hp schematically shown in FIG. 3. Advantageously, the dam height Hd is greater than the piezoelectric element height Hp. As a result, the receiving space 7 can be completely filled with the polymer 17, so that the polymer 17 also covers the at least one piezoelectric element 3, in particular the cantilever arm 9, and can form the diaphragm 4. The thickness D of the diaphragm 4 can result from the difference between the dam height Hd and the piezoelectric element height Hp. The diaphragm 4 is then flush with the dam arrangement 5.

The dam height Hd can be, for example, between 0.3 mm and 2 mm. The dam height Hd can also be 0.55 mm. The piezoelectric element height Hp can be between 0.2 mm and 1.5 mm. The piezoelectric element height Hp can also be 0.45 mm. A thickness (not indicated here) of the support substrate 2 in the view shown in FIG. 3 can be 0.25 mm. The thickness of the support substrate 2 can also be between 0.1 mm and 1.5 mm, however.

Furthermore, as schematically shown in FIG. 3, the MEMS sound transducer 1 has a transverse direction Q. The transverse direction Q is oriented transversely to the stroke axis H. The transverse direction Q is oriented in parallel to the plane of the support substrate 2.

Moreover, the at least one piezoelectric element 3 is spaced apart from the dam arrangement 5 in the transverse direction Q. A distance A is present between the dam arrangement 5 and the piezoelectric element 3 and schematically indicated in FIG. 3.

As shown in FIG. 3, the distance A between the dam arrangement 5 and the piezoelectric elements 3 is not constant. The distance A can change depending on the desired arrangement.

Figure 4:
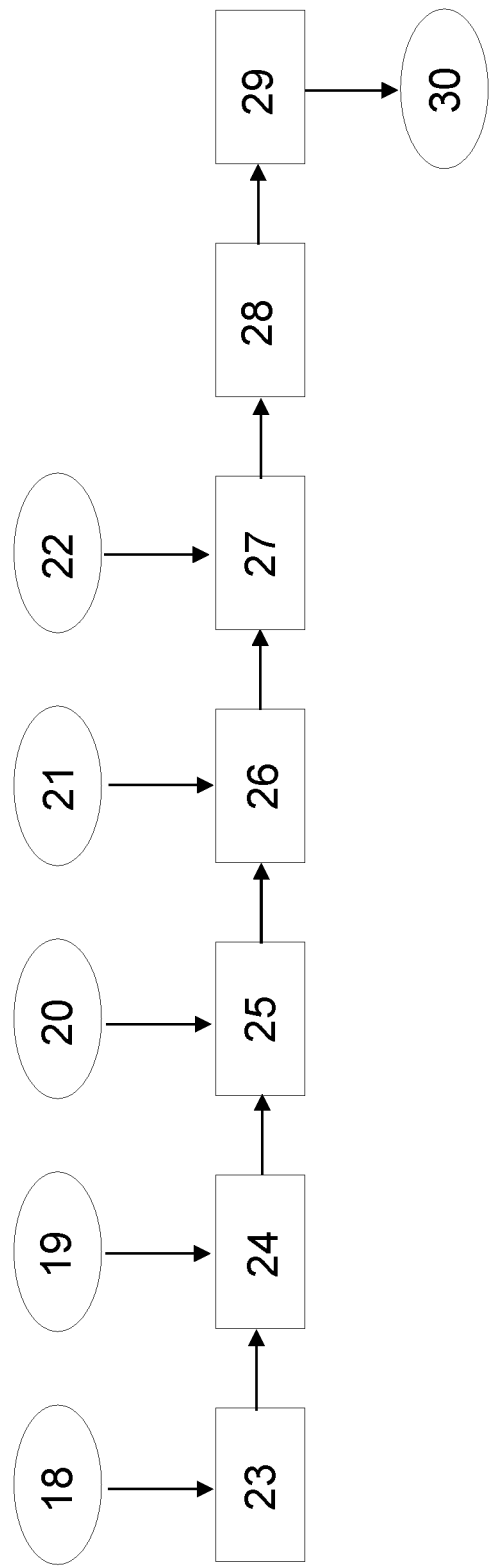
FIG. 4 shows a flowchart of a method for manufacturing the MEMS sound transducer.

FIG. 4 shows a flowchart of a method for manufacturing the MEMS sound transducer 1. The MEMS sound transducer 1 can have at least one feature of the preceding description, in particular of FIGS. 1-3. Furthermore, the MEMS sound transducer 1 can be designed according to at least one feature of the preceding description, in particular of FIGS. 1-3. In particular, the reference characters of the preceding figures are utilized here for the physical features. For the sake of simplicity, the features are not explained once again when they have the same or at least similar properties as in the preceding figures.

In a first step 18, the support substrate 2 can be provided. The support substrate 2 can be, for example, a circuit board, which is appropriately manufactured. The support substrate 2 can also be a wafer, which can be or is treated by means of a deposition and/or etching process.

In a following step 23, the support substrate 2 is equipped. For example, an ASIC and/or a control unit can be placed onto the support substrate 2. Strip conductors or, for example, the connection points 16 can also be arranged thereon, however.

In a next step 19, an adhesive is provided. The adhesive can be, for example, an electrically insulating, i.e., non-conductive, adhesive. With the aid of the adhesive, further elements, such as, for example, the dam arrangement 5, the dam unit 6, and/or the piezoelectric element 3, can be adhesively bonded onto the support substrate 2.

In a following step 24, the adhesive is spread or arranged on the support substrate 2.

In a following step (not shown here), the dam arrangement 5, in particular the at least one dam unit 6, can also be placed onto the support substrate 2. The dam arrangement 5, in particular the at least one dam unit 6, can also be arranged on the support substrate 2 by means of the adhesive. The dam arrangement 5 can also be first placed onto the support substrate 2 in a subsequent step, however.

In a next step 20, the at least one piezoelectric element 3 is provided. When multiple piezoelectric elements 3 are placed upon the support substrate 2, multiple piezoelectric elements 3 are provided, of course. The multiple piezoelectric elements 3 can also be combined and/or connected to each other to form a piezoelectric unit 31. As a result, the multiple piezoelectric elements 3 can also be placed upon the support substrate 2 as a piezoelectric unit 31.

In a subsequent step 25, the at least one piezoelectric element 3 is placed upon the support substrate 2. This can take place by means of so-called "pick and place". For example, an assembly unit, in particular an assembly robot, can grasp the at least one piezoelectric element 3 from a stocking unit and place it onto the support substrate 2. Multiple piezoelectric elements 3 can be placed onto the support substrate 2 one after the other and/or simultaneously. The multiple piezoelectric elements 3 can be arranged in the shape of a polygon, in particular of a hexagon according to FIG. 2. The piezoelectric unit 31 schematically shown in FIG. 3 can also be arranged. The dam arrangement 5 can also be first placed upon the support substrate 2 when the piezoelectric element 3 is already arranged on the support substrate 2.

The multiple piezoelectric elements 3 can also be combined to form a piezoelectric unit 31. For example, the piezoelectric elements 3 can be manufactured together and, together, form the piezoelectric unit 31. For example, the base elements 8 of the piezoelectric elements 3 can be integrally formed as a unitary structure during a casting or molding operation, so that the piezoelectric elements 3 are contiguous and form the piezoelectric unit 31. The piezoelectric unit 31 is then placed upon the support substrate 2.

In a step that is not shown here, when all components have been placed upon the support substrate 2, a curing step for the adhesive can be carried out. For example, the adhesive can be cured by supplying heat.

In a following step 21, a line 15 is provided. Multiple lines 15 are provided, of course, when multiple piezoelectric elements 3 are to be provided with a line 15. One piezoelectric element 3 can also be provided with multiple lines 15.

In a next step 26, the at least one line 15 is connected to the at least one piezoelectric element 3 and/or the connection point 16. The line 15 can be, for example, soldered.

In a following step 22, the liquid and/or flowable polymer 17 is provided. The polymer 17 can first be liquefied and/or brought into a flowable condition, for example, in this step 22. For example, the initially solid polymer 17 can be heated, so that it becomes flowable and/or liquid. The polymer 17 can also be mixed. The polymer 17 can be, for example, at least one two-component mixture, wherein one component is a hardener. Multiple components can also be mixed. Preferably, the polymer 17 is based on silicone. The polymer 17 can cure, for example, itself, i.e., without external influence.

In a next step 27, the flowable and/or liquid polymer 17 is poured around the at least one piezoelectric element 3. The polymer 17 can be poured over the piezoelectric element 3 until it is completely covered. It is advantageous when the dam arrangement 5 is arranged on the support substrate 2. With the dam arrangement 5, the receiving space 7 forms. The dam arrangement 5, the support substrate 2, and/or the piezoelectric element 3 then have the form of a basin. The flowable polymer 17 can be filled into the receiving space 7 and/or between the dam arrangement 5. As a result, the piezoelectric element 3 can be cast around in an easy way. The polymer 17 can be poured in until the piezoelectric element 3 is covered. Alternatively, the receiving space 7 can also be completely filled. The dam arrangement 5 extends above the piezoelectric element 3. As shown in FIG. 3, the dam height Hd can be greater than the piezoelectric element height Hp. Advantageously, the line 15 is also arranged in the receiving space 7, so that it is also cast in the polymer 17.

In a further step (not shown here), the polymer 17 can be stripped off when it is arranged in the receiving space 7 and between the dam arrangement 5. For example, according to FIG. 1, the dam arrangement 5 forms a plane, which is arranged over the piezoelectric element 3. In this way, excess polymer 17 can be pulled off with a pull-off edge. Consequently, the polymer 17 and the dam arrangement 5 are flush with one another (as shown, for example, in FIG. 3). The pulling-off can also be referred to as stripping.

In a following step (not shown here), the polymer 17 can be cured, so that the diaphragm 4 forms. For this purpose, the polymer 17 can be treated, for example, with heat. Alternatively, the polymer 17 can be a self-curing polymer.

In a subsequent step 28, when multiple MEMS sound transducers 1 are arranged on the support substrate 2, the appropriate MEMS sound transducers 1 can be separated. Multiple MEMS sound transducers 1 can be arranged on the support substrate 2 in order to form multiple MEMS sound transducers 1 in one process. Multiple dam arrangements 5 can therefore be arranged on the support substrate 2, wherein the piezoelectric elements 3 are arranged in the dam arrangements 5. Alternatively, the plurality of piezoelectric elements 3 can also be arranged on the support substrate 2 first and, thereafter, the dam arrangements 5.

When multiple MEMS sound transducers 1 are arranged on the support substrate 2, the flowable polymer 17 can be simultaneously filled into all receiving spaces 7. Thereupon, the polymer 17 can be pulled off and/or stripped off, so that multiple diaphragms 4 can be formed in a single method step.

In a following step 29, the MEMS sound transducer 1 can be tested.

In a following step 30, the MEMS sound transducer 1 can be completed. It can be, for example, installed in a housing.

The present invention is not limited to the represented and described exemplary embodiments. Modifications within the scope of the claims are also possible, as is any combination of the features, even if they are represented and described in different exemplary embodiments.

LIST OF REFERENCE CHARACTERS

1 MEMS sound transducer
2 support substrate
3 piezoelectric element
4 diaphragm
5 dam arrangement
6 dam unit
7 receiving space
8 base element
9 cantilever arm
10 first end
11 second end
12 spring section
13 hollow space
14 passage opening
15 line
16 connection point
17 polymer
18 providing the support substrate
19 providing the adhesive
20 providing the piezoelectric unit
21 providing the line
22 providing the polymer
23 equipping the support substrate
24 applying the adhesive
25 arranging the piezoelectric element
26 arranging the line
27 casting the polymer
28 separation
29 testing
30 completion
31 piezoelectric unit
H stroke axis
Z center
Hd dam height
Hp piezoelectric element height
D thickness
Q transverse direction
A distance

The invention claimed is:

1. A method for manufacturing a MEMS sound transducer for generating and/or detecting sound waves in the audible wavelength range and/or in the ultrasonic range, the method comprising the following steps:

arranging multiple piezoelectric elements on a support substrate, wherein each of the piezoelectric elements is defined by a base element at a first end of each piezoelectric element and a cantilever arm defined at a second end of each piezoelectric element opposite the first end, wherein each of the base elements of the multiple piezoelectric elements is arranged on the support substrate and is formed to extend away from the support substrate over a first distance measured along a stroke axis, wherein each respective cantilever arm is connected at a first end to each respective base element so that a second end of the respective cantilever arm disposed opposite the first end and extending in a direction generally normal to the stroke axis can oscillate in the direction of the stroke axis, wherein the multiple piezoelectric elements are arranged on the support substrate in such a way that the respective second ends of the cantilever arms of the multiple piezoelectric elements meet in a center, wherein each of the cantilever arms is disposed at a second distance measured in a direction along the stroke axis from the support substrate;

forming a dam arrangement on the support substrate, wherein the dam arrangement is formed to extend away from the support substrate over a third distance measured along a stroke axis and so that the multiple piezoelectric elements are completely bordered by the dam arrangement; and forming a diaphragm that covers the multiple piezoelectric elements, wherein in order to form the diaphragm, a flowable and curable polymer, which forms the diaphragm after curing, is cast around the multiple piezoelectric elements that are bordered within the dam arrangement.

2. The method of claim 1, further comprising the step of removing any polymer that has become arranged over the dam arrangement.

3. The method of claim 1, wherein the dam arrangement and at least one piezoelectric element are adhesively bonded onto the support substrate.

4. The method of claim 1, wherein the base elements are designed as one piece with one another.

5. The method claim 1, wherein the at least one piezoelectric element is connected with at least one line to a connection point on the support substrate, wherein the polymer is cast around the line.

6. The method of claim 1, further comprising defining acoustic openings and a passage opening in the support substrate, wherein the passage opening is defined in an area spaced apart from the center in the direction of the stroke axis.

7. The MEMS sound transducer of claim 1, wherein the at least one piezoelectric element and the dam arrangement are spaced apart from one another in a transverse direction that is normal to the stroke axis.

8. The method of claim 1, further comprising the step of removing any polymer from the dam arrangement.

9. The method of claim 1, wherein the dam arrangement is cast onto the support substrate.

10. The method of claim 1, wherein the third distance is greater than the second distance, and the second distance is greater than the first distance.

11. A MEMS sound transducer for generating and/or detecting sound waves in the audible wavelength range and/or in the ultrasonic range, the MEMS sound transducer comprising:

a support substrate extending generally in a plane disposed normal to a stroke axis;

a dam arrangement formed on the support substrate, wherein the dam arrangement is configured to extend away from the support substrate over a first distance measured along the stroke axis and configured to define a receiving space within the dam arrangement;

multiple piezoelectric elements disposed within the receiving space of the dam arrangement so that the multiple piezoelectric elements are completely bordered by the dam arrangement, wherein each of the piezoelectric elements is defined by a base element at a first end of each piezoelectric element and a cantilever arm defined at a second end of each piezoelectric element opposite the first end, wherein each of the base elements of the multiple piezoelectric elements is arranged on the support substrate and is formed to extend away from the support substrate over a second distance measured along the stroke axis, wherein each respective cantilever arm is connected at a first end to each respective base element so that a second end of the respective cantilever arm disposed opposite the first end and extending in a direction generally normal to the stroke axis can oscillate in the direction of the stroke axis, wherein the multiple piezoelectric elements are arranged on the support substrate in such a way that the respective second ends of the cantilever arms of the multiple piezoelectric elements meet in a center, wherein each of the cantilever arms is disposed at a third distance measured in a direction along the stroke axis from the support substrate; and a diaphragm that covers the multiple piezoelectric elements, wherein the diaphragm is composed of a cured polymer, which forms the diaphragm after curing, and wherein the diaphragm is disposed around the multiple piezoelectric elements.

12. The MEMS sound transducer of claim 11, wherein the first distance is greater than the third distance, and the third distance is greater than the second distance.

13. The MEMS sound transducer of claim 11, wherein the multiple piezoelectric elements are indirectly connected to each other via the diaphragm.

14. The MEMS sound transducer of claim 13, wherein the base elements of the multiple piezoelectric elements are connected to each other and form a piezoelectric unit.

15. The MEMS sound transducer of claim 13, wherein an abutting region between two adjacent piezoelectric elements is tight enough to withstand penetration of flowable polymer through the abutting region.

* * * * *